(12) United States Patent
Yoon et al.

(10) Patent No.: US 7,579,284 B2
(45) Date of Patent: Aug. 25, 2009

(54) ETCHING SOLUTION, METHOD OF FORMING A PATTERN USING THE SAME, METHOD OF MANUFACTURING A MULTIPLE GATE OXIDE LAYER USING THE SAME AND METHOD OF MANUFACTURING A FLASH MEMORY DEVICE USING THE SAME

(75) Inventors: Byoung-Moon Yoon, Suwon-si (KR); Ji-Hong Kim, Seoul (KR); Yong-Sun Ko, Suwon-si (KR); Kyung-Hyun Kim, Seoul (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 258 days.

(21) Appl. No.: 11/482,773

(22) Filed: Jul. 10, 2006

(65) Prior Publication Data

US 2007/0015372 A1    Jan. 18, 2007

(30) Foreign Application Priority Data

Jul. 12, 2005    (KR) ...................... 10-2005-0062488

(51) Int. Cl.
*H01L 21/311* (2006.01)
(52) U.S. Cl. ........................ 438/745; 438/697; 438/723; 438/724; 438/725; 438/733; 438/734; 216/37; 216/41
(58) Field of Classification Search .................. 438/745
See application file for complete search history.

(56) References Cited

U.S. PATENT DOCUMENTS 6,207,510 B1 * 3/2001 Abeln et al. ................. 438/276

(Continued)

FOREIGN PATENT DOCUMENTS

KR    1998-84299    12/1998

(Continued)

OTHER PUBLICATIONS

S. Snitovskii, Russian Microelectronics, vol. 30, No. 3, (2001), pp. 223-227.*

*Primary Examiner*—Nadine Norton
*Assistant Examiner*—Maki Angadi
(74) *Attorney, Agent, or Firm*—Harness, Dickey & Pierce, P.L.C.

(57) ABSTRACT

Example embodiments of the present invention relate to an etching solution, a method of forming a pattern using the same, a method of manufacturing a multiple gate oxide layer using the same and a method of manufacturing a flash memory device using the same. Other example embodiments of the present invention relate to an etching solution having an etching selectivity between a polysilicon layer and an oxide layer, a method of forming a pattern using an etching solution using the same, a method of manufacturing a multiple gate oxide layer using the same, and a method of manufacturing a flash memory device using the same. An etching solution including hydrogen peroxide ($H_2O_2$) and ammonium hydroxide ($NH_4OH$) by a volume ratio of about 1:2 to about 1:10 mixed in water. In a method of forming a pattern and methods of manufacturing a multiple gate oxide layer and a flash memory device, a polysilicon layer may be formed on a substrate. An insulation layer pattern including an opening exposing the polysilicon layer may be formed on the polysilicon layer. The polysilicon layer exposed by the insulation layer pattern may be etched using the etching solution. A polysilicon layer pattern may be formed on the substrate using the etching solution.

14 Claims, 10 Drawing Sheets

U.S. PATENT DOCUMENTS

| | | |
|---|---|---|
| 6,940,121 B2* | 9/2005 | Gehring .................. 257/315 |
| 7,008,876 B2* | 3/2006 | Lee et al. ................ 438/697 |
| 2003/0082913 A1* | 5/2003 | Danielson et al. ......... 438/690 |
| 2005/0277248 A1* | 12/2005 | Kim et al. ............... 438/253 |

FOREIGN PATENT DOCUMENTS

| | | |
|---|---|---|
| KR | 10-271769 | 8/2000 |

* cited by examiner

US 7,579,284 B2

ETCHING SOLUTION, METHOD OF FORMING A PATTERN USING THE SAME, METHOD OF MANUFACTURING A MULTIPLE GATE OXIDE LAYER USING THE SAME AND METHOD OF MANUFACTURING A FLASH MEMORY DEVICE USING THE SAME

PRIORITY STATEMENT

This application claims priority under 35 USC § 119 to Korean Patent Application No. 2005-62488 filed on Jul. 12, 2005, in the Korean Intellectual Property Office (KIPO), the entire contents of which are herein incorporated by reference.

BACKGROUND

1. Field

Example embodiments of the present invention relate to an etching solution, a method of forming a pattern using the same, a method of manufacturing a multiple gate oxide layer using the same and a method of manufacturing a flash memory device using the same. Other example embodiments of the present invention relate to an etching solution having an etching selectivity between a polysilicon layer and an oxide layer, a method of forming a pattern using an etching solution using the same, a method of manufacturing a multiple gate oxide layer using the same, and a method of manufacturing a flash memory device using the same.

2. Description of the Related Art

A semiconductor device may be mainly classified into two types: random access memory (RAM) and read only memory (ROM). The RAM may be a volatile memory that loses the data when the power supply is cut, but performs input and output of the data at a higher speed. Examples of the RAM are a dynamic random access memory (DRAM), a static random access memory (SRAM) and/or the like. The ROM may be a nonvolatile memory that maintains the data when the power supply is cut, but performs input and output of the data at a lower speed. Among the ROMs, an electrically erasable and programmable ROM (EEPROM) and a flash memory may have been recently used.

Flash memory may be an advanced device from the EEPROM that is electrically erasable at a higher speed. The flash memory electrically controls input and output of the data by a mechanism of Fowler-Nordheim tunneling (F-N tunneling) and/or hot electron injection. The flash memory may be generally classified into a NAND type flash memory and/or a NOR type flash memory. In the NAND type flash memory, cell transistors of n consist of a unit string and the unit string may be disposed in parallel between a bit line and a ground line. In the NOR type flash memory, each cell transistor may be disposed in parallel between a bit line and a ground line. The NAND type flash memory may be utilized for a higher-speed performance and the NOR type flash memory may be utilized for a higher integration.

In the above-mentioned device, for example, the DRAM, the SRAM, the flash memory and/or the like, a polysilicon layer pattern may be used for a gate electrode. The polysilicon layer pattern may be formed by a deposition process of polysilicon, a photolithography process, an etching process and/or any other suitable process. The etching process may be generally performed by a dry etching process using plasma. When a polysilicon layer is etched by the dry etching process using plasma, a silicon substrate below the polysilicon layer may often have etching damage caused by the plasma. In order to reduce plasma damage to the silicon substrate, the polysilicon layer may be etched by a wet etching process using an etching solution. When the polysilicon layer is etched by the wet etching process using the etching solution, an oxide layer and/or the silicon substrate may not be damaged by the etching solution.

The wet etching process using the etching solution for the polysilicon layer may be applied to a method of forming a multi tunnel oxide layer in the NOR type flash memory and/or a method of forming a floating gate layer in the NAND type flash memory. The wet etching process using the etching solution for the polysilicon layer may be applied to remove a polysilicon layer without damage to an oxide layer in a selective epitaxial growth (SEG) method.

A standard clean 1 (SC1) solution may be used as the etching solution. The SC1 solution may include ammonium hydroxide ($NH_4OH$), hydrogen peroxide ($H_2O_2$) and water. A volume ratio of ammonium hydroxide, hydrogen peroxide and water may be about 2.2:8.8:80. An oxide layer and a polysilicon layer may have an etching rate substantially the same when the SC1 solution is used in the wet etching process. An etching solution that has a lower etching rate for the oxide layer may be required.

SUMMARY

Example embodiments of the present invention relate to an etching solution, a method of forming a pattern using the same, a method of manufacturing a multiple gate oxide layer using the same and a method of manufacturing a flash memory device using the same. Other example embodiments of the present invention relate to an etching solution having an etching selectivity between a polysilicon layer and an oxide layer, a method of forming a pattern using an etching solution using the same, a method of manufacturing a multiple gate oxide layer using the same, and a method of manufacturing a flash memory device using the same.

Example embodiments of the present invention provide a method of forming a pattern using an etching solution having improved characteristics. Example embodiments of the present invention provide a method of manufacturing a multiple gate oxide layer using the same and other example embodiments of the present invention provide a method of manufacturing a flash memory device using an etching solution having improved characteristics.

According to example embodiments of the present invention, there is provided a method of forming a pattern. In the method, a polysilicon layer may be formed on a substrate. An insulation layer pattern including an opening exposing the polysilicon layer may be formed on the polysilicon layer. The polysilicon layer exposed by the insulation layer pattern may be etched using an etching solution to form a polysilicon layer pattern. The etching solution may include hydrogen peroxide ($H_2O_2$) and ammonium hydroxide ($NH_4OH$) by a volume ratio of about 1:2 to about 1:10 mixed in water.

In example embodiments of the present invention, the etching solution may include about 1 percent to about 6 percent by volume of hydrogen peroxide, about 3 percent to about 10 percent by volume of ammonium hydroxide and about 84 percent to about 96 percent by volume of water based on a total volume of the etching solution. In example embodiments of the present invention, an etching rate ratio between the insulation layer pattern and the polysilicon layer may be in a range of about 1:1.3 to about 1:3.

In example embodiments of the present invention, the insulation layer pattern may include silicon oxide. In example embodiments of the present invention, an insulation layer may be formed on the polysilicon layer. A photoresist pattern may be formed on the insulation layer. The insulation layer exposed by the photoresist pattern may be etched to form the insulation layer pattern including the opening exposing the polysilicon layer. The photoresist pattern may be removed.

In example embodiments of the present invention, etching the polysilicon layer may be performed at a temperature of about 75° C. to about 95° C. In example embodiments of the present invention, an etching rate of the polysilicon layer may be about 17 Å/min to about 32 Å/min and wherein an etching rate of the insulation layer pattern may be about 10 Å/min to about 13 Å/min.

According to other example embodiments of the present invention, there is provided a method of manufacturing a multiple gate oxide layer. In the method, a first oxide layer having a first thickness may be formed on a substrate. A first polysilicon layer may be formed on the first oxide layer. A first insulation layer pattern exposing the first polysilicon layer may be formed on the first polysilicon layer. The first polysilicon layer exposed by the first insulation layer pattern and the first oxide layer may be etched using an etching solution until the substrate is exposed to form a first polysilicon layer pattern and a first oxide layer pattern, respectively. The etching solution may include hydrogen peroxide and ammonium hydroxide by a volume ratio of about 1:2 to about 1:10 mixed in water. A second oxide layer pattern having a second thickness substantially thicker than the first thickness may be formed on an exposed substrate.

In example embodiments of the present invention, a second oxide layer having the second thickness may be formed on the exposed substrate. The first insulation layer pattern may be removed. A second polysilicon layer may be formed on the second oxide layer and the first polysilicon layer. A second insulation layer pattern exposing the second polysilicon layer may be formed. The second polysilicon layer exposed by the second insulation layer pattern and the second oxide layer may be etched using the etching solution. In example embodiments of the present invention, the etching solution may include about 1 percent to about 6 percent by volume of hydrogen peroxide, about 3 percent to about 10 percent by volume of ammonium hydroxide and about 84 percent to about 96 percent by volume of water based on a total volume of the etching solution.

In example embodiments of the present invention, the first insulation layer pattern may include silicon oxide. In example embodiments of the present invention, an etching rate ratio between the first insulation layer pattern and the first polysilicon layer may be in a range of about 1:1.3 to about 1:3.

In example embodiments of the present invention, etching the first polysilicon layer may be performed at a temperature of about 75° C. to about 95° C.

According to still other example embodiments of the present invention, there is provided a method of manufacturing a flash memory device. In the method, an oxide layer may be formed on a substrate. A first polysilicon layer may be formed on the oxide layer. An insulation layer pattern exposing the first polysilicon layer may be formed on the first polysilicon layer. The first polysilicon layer exposed by the insulation layer pattern, the oxide layer and the substrate may be etched using an etching solution to form a first polysilicon layer pattern, a first oxide layer pattern and a trench. The etching solution may include hydrogen peroxide and ammonium hydroxide by a volume ratio of about 1:2 to about 1:10 mixed in water. A trench structure filling the trench may be formed using an insulation material. The trench structure may be partially removed to form an isolation layer exposing a portion of a sidewall of the polysilicon layer pattern. The insulation layer pattern may be removed. A dielectric layer may be formed on the first polysilicon layer pattern. A second polysilicon layer filling a space between the first polysilicon layer patterns may be formed on the dielectric layer.

In example embodiments of the present invention, the etching solution may include about 1 percent to about 6 percent by volume of hydrogen peroxide, about 3 percent to about 10 percent by volume of ammonium hydroxide and about 84 percent to about 96 percent by volume of water based on a total volume of the etching solution. In example embodiments of the present invention, an etching rate ratio between the oxide layer and the first polysilicon layer may be in a range of about 1:1.3 to about 1:3. In example embodiments of the present invention, etching the first polysilicon layer may be performed at a temperature of about 75° C. to about 95° C.

According to example embodiments of the present invention, when a polysilicon layer exposed by an oxide layer pattern is etched using an etching solution, the polysilicon layer may be etched without overly etching of the oxide layer pattern. In a formation of a polysilicon layer pattern, etched damage to an oxide layer (e.g., a tunnel oxide layer) may be reduced. When a silicon substrate exposed by an oxide layer pattern including an opening is etched, an enlargement of the opening due to unnecessary etching of the oxide layer pattern may be reduced. In the wet etching process using the etching solution, the polysilicon layer and the silicon substrate may be more uniformly etched without etching an oxide layer.

BRIEF DESCRIPTION OF THE DRAWINGS

Example embodiments of the present invention will be more clearly understood from the following detailed description taken in conjunction with the accompanying drawings.

FIGS. 1 to 3 are diagrams illustrating a method of forming a pattern in accordance with example embodiments of the present invention;

FIGS. 4 to 8 are diagrams illustrating a method of forming a gate oxide layer using an etching solution in accordance with example embodiments of the present invention;

FIGS. 9 to 14 are diagrams illustrating a method of manufacturing a flash memory device using an etching solution in accordance with example embodiments of the present invention;

FIG. 15 is a graph illustrating an etching rate of a polysilicon layer according to a composition and a temperature of an etching solution in accordance with example embodiments of the present invention;

FIG. 16 is a graph illustrating an etching rate of an oxide layer according to a composition and a temperature of an etching solution in accordance with example embodiments of the present invention; and FIG. 17 is a graph illustrating an etching selectivity between a polysilicon layer and an oxide layer according to a composition and a temperature of an etching solution in accordance with example embodiments of the present invention.

DETAILED DESCRIPTION OF EXAMPLE EMBODIMENTS OF THE PRESENT INVENTION

Figure 1:
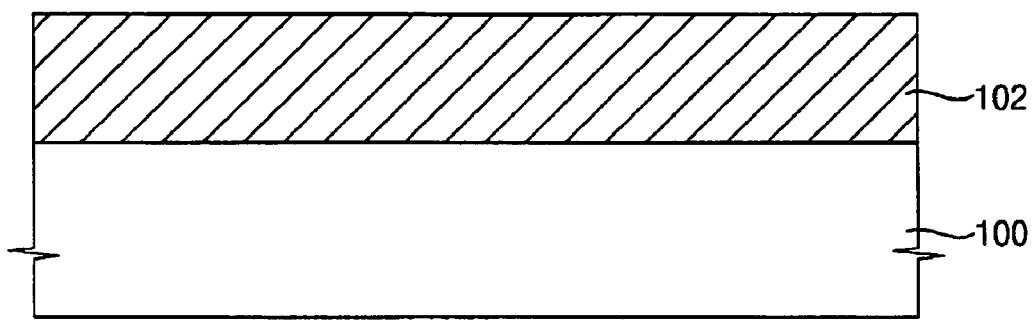
FIGS. 1-17 represent non-limiting, example embodiments of the present invention as described herein.

Various example embodiments of the present invention are described more fully hereinafter with reference to the accompanying drawings, in which example embodiments of the present invention are shown. Example embodiments of the present invention may, however, be embodied in many different forms and should not be construed as limited to the example embodiments set forth herein. Rather, these embodiments are provided so that this disclosure will be thorough and complete, and will fully convey the scope of example embodiments of the present invention to those skilled in the art. In the drawings, the sizes and relative sizes of layers and regions may be exaggerated for clarity.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. A first element, component, region, layer or section discussed below could be termed a second element, component, region, layer or section without departing from the teachings of the example embodiments of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. The exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the example embodiments of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized, example embodiments (and intermediate structures) of the present invention. As such, variations from the shapes of the illustrations as a result, for example, of manufacturing techniques and/or tolerances, are to be expected. Example embodiments of the present invention should not be construed as limited to the particular shapes of regions illustrated herein but are to include deviations in shapes that result, for example, from manufacturing. For example, an implanted region illustrated as a rectangle will, typically, may have rounded or curved features and/or a gradient of implant concentration at its edges rather than a binary change from implanted to non-implanted region. Likewise, a buried region formed by implantation may result in some implantation in the region between the buried region and the surface through which the implantation takes place. The regions illustrated in the figures are schematic in nature and their shapes are not intended to illustrate the actual shape of a region of a device and are not intended to limit the scope of example embodiments of the present invention.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention relate to an etching solution, a method of forming a pattern using the same, a method of manufacturing a multiple gate oxide layer using the same and a method of manufacturing a flash memory device using the same. Other example embodiments of the present invention relate to an etching solution having an etching selectivity between a polysilicon layer and an oxide layer, a method of forming a pattern using an etching solution using the same, a method of manufacturing a multiple gate oxide layer using the same, and a method of manufacturing a flash memory device using the same.

Etching Solution

A polysilicon layer may be etched, without unnecessary damage to an oxide layer used as an etching mask of the polysilicon layer, by using an etching solution in accordance with example embodiments of the present invention. In a formation of a polysilicon layer pattern, etched damage to an oxide layer (e.g., a tunnel oxide layer) or a silicon substrate may be reduced. An enlargement of an opening due to an etching of the oxide layer may be reduced.

According to example embodiments of the present invention, when the etching solution is employed in an etching process of a polysilicon layer and/or a silicon substrate, the polysilicon layer and/or the silicon substrate may have a higher etching selectivity relative to an oxide layer. The polysilicon layer and/or the silicon substrate may be more uniformly etched. The etching solution may include hydrogen peroxide ($H_2O_2$) and ammonium hydroxide ($NH_4OH$) by a volume ratio of about 1:2 to about 1:10 mixed in water ($H_2O$). The etching solution may include about 1 percent to about 6 percent by volume of hydrogen peroxide, about 3 percent to about 10 percent by volume of ammonium hydroxide, and about 84 percent to about 96 percent by volume of water based on a total volume of the etching solution.

Hydrogen peroxide included in the etching solution may etch surfaces of a polysilicon layer and/or a silicon substrate exposed by an oxide layer and may control an etching rate of the polysilicon layer and/or the silicon substrate in the etching process. When the etching solution includes less than about 1 percent by volume of hydrogen peroxide, the etching rate of the polysilicon layer and/or the silicon substrate may be difficult to control. When the etching solution includes more than about 6 percent by volume of hydrogen peroxide, the etching rate of the polysilicon layer and/or the silicon substrate may be reduced. The etching solution may include about 1 percent to about 6 percent by volume of hydrogen peroxide, for example, about 1 percent to about 4 percent by volume of hydrogen peroxide, for example, about 1 percent to about 3 percent by volume of hydrogen peroxide.

Ammonium hydroxide included in the etching solution may also control an etching rate of the polysilicon layer and/or the silicon substrate in the etching process. When the etching solution includes less than about 3 percent by volume of ammonium hydroxide, the etching rate of the polysilicon layer and/or the silicon substrate may be reduced. When the etching solution includes more than about 10 percent by volume of ammonium hydroxide, the etching rate of the polysilicon layer and/or the silicon substrate may be increased and the oxide layer may be considerably etched. The etching solution may include about 3 percent to about 10 percent by volume of ammonium hydroxide, for example, about 4 percent to about 10 percent by volume of ammonium hydroxide, for example, about 8 percent to about 10 percent by volume of ammonium hydroxide.

The etching solution may include about 84 percent to about 96 percent by volume of water. Water may include pure water and/or deionized water that does not include any impurities. Water may serve as a solvent in the etching solution. A concentration or characteristics of the etching solution may vary according to an amount of water.

In example embodiments of the present invention, an etching solution may be used in a wet etching process for forming a polysilicon layer pattern in a manufacturing process of a semiconductor device (e.g., a DRAM device, an SRAM device, a NOR type flash memory device, a NAND type flash memory device and/or any other suitable device). In other example embodiments of the present invention, the etching solution may be used to remove impurities in a silicon substrate exposed by an opening included in an oxide layer. In the wet etching process using the etching solution, a polysilicon layer and/or a silicon substrate may be more uniformly etched without unnecessarily etching the oxide layer.

Method of Forming a Pattern

Figure 2:
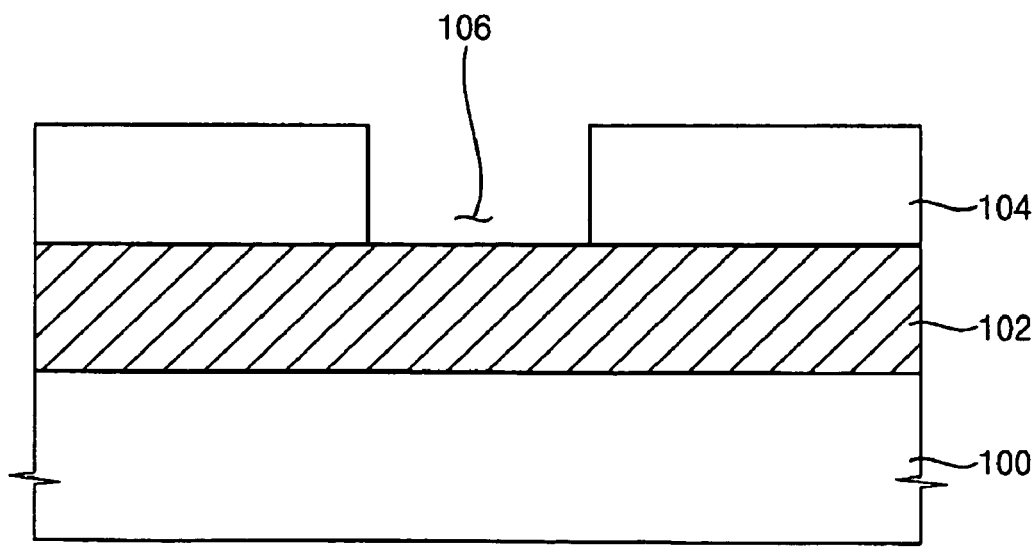
Figure 3:
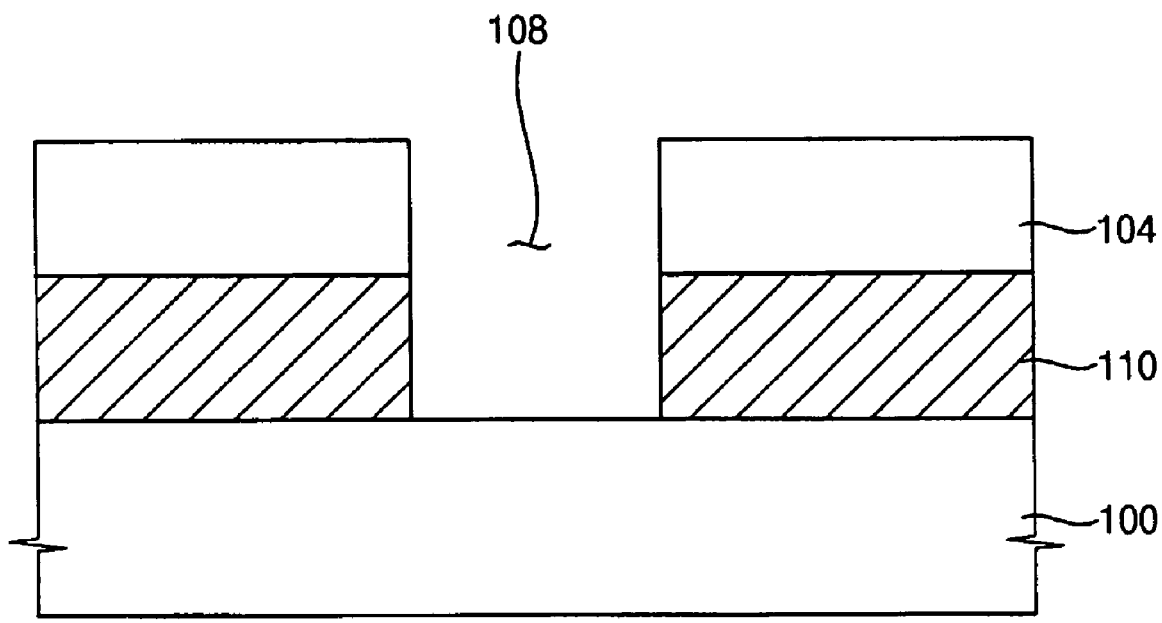

FIGS. 1 to 3 are diagrams illustrating a method of forming a pattern in accordance with example embodiments of the present invention. Referring to FIG. 1, a structure layer 102 including polysilicon may be formed on a substrate 100. The substrate 100 may include a silicon wafer, a silicon-on-insulator (SOI) substrate and/or the like. The structure layer 102 may correspond to a polysilicon layer that may be formed on a tunnel oxide layer and/or a gate oxide layer. In example embodiments of the present invention, the tunnel oxide layer and/or the gate oxide layer may be formed on the substrate 100 by a thermal oxidation process and/or a chemical vapor deposition (CVD) process. The structure layer 102 may be formed on the tunnel oxide layer and/or the gate oxide layer. The structure layer 102 may be formed by a CVD process.

Referring to FIG. 2, an insulation layer pattern 104 may be formed on the structure layer 102. For example, an insulation layer may be formed on the structure layer 102. The insulation layer may be formed using an oxide (e.g., boron phosphor silicate glass (BPSG), phosphor silicate glass (PSG), undoped silicate glass (USG), spin on glass (SOG), tetraethyl orthosilicate (TEOS), middle temperature oxide (MTO) and/or any other suitable oxide). For example, the insulation layer may be formed using MTO. A photoresist film (not shown) may be formed on the insulation layer. The photoresist film may be formed by more uniformly coating a photoresist composition on the insulation layer. An exposure process and/or a developing process may be performed on the photoresist film to thereby form a photoresist pattern on the insulation layer. The insulation layer may be etched using the photoresist pattern as an etching mask so that an insulation layer pattern 104 may be formed on the structure layer 102. The insulation layer pattern 104 includes a first opening 106 that may expose a portion of the structure layer 102.

Referring to FIG. 3, the portion of the structure layer 102 exposed by the insulation layer pattern 104 may be selectively etched. A structure layer pattern 110 including a second opening 108 may be formed on the substrate 100. In example embodiments of the present invention, the structure layer 102 may be etched by a wet etching process using an etching solution to form the structure layer pattern 110. The etching solution may include hydrogen peroxide ($H_2O_2$) and ammonium hydroxide ($NH_4OH$) by a volume ratio of about 1:2 to about 1:10 mixed in water.

The etching solution may include about 1 percent to about 6 percent by volume of hydrogen peroxide, about 3 percent to about 10 percent by volume of ammonium hydroxide and about 84 percent to about 96 percent by volume of water based on a total volume of the etching solution. An etching rate ratio between the insulation layer pattern 104 and the structure layer 102 may be in a range of about 1:1.3 to about 1:3 in the etching process using the etching solution. An etching ability of the etching solution may depend on a temperature in the wet etching process. In example embodiments of the present invention, the wet etching process may be performed at a temperature of more than about 60° C., for example, a temperature of about 75° C. to about 95° C. An etching rate for the structure layer 102 at a temperature of about 75° C. to about 95° C. may be in a range of about 17 Å/min to about 32 Å/min. An etching rate for the insulation layer pattern 104 at the temperature of about 75° C. to about 95° C. may be in a range of about 10 Å/min to about 13 Å/min.

In example embodiments of the present invention, a rinsing process may be further executed on the substrate 100. The rinsing process may remove a remaining etching solution and particles from the substrate 100. The rinsing process may be performed using deionized water. In example embodiments of the present invention, a drying process for removing deionized water used in the rinsing process from the substrate 100 may be further carried out on the substrate 100. The structure layer pattern 110 may be employed in a manufacturing process of various semiconductor devices (e.g., a DRAM device, an SRAM device, a flash memory device and/or any other suitable device). In accordance with example embodiments of the present invention, a method of forming the structure layer pattern 110 may retard or prevent the insulation layer pattern 104 from unnecessarily etching. Damage to the substrate 100 may be reduced.

Method of Manufacturing a Multiple Gate Oxide Layer

Figure 4:
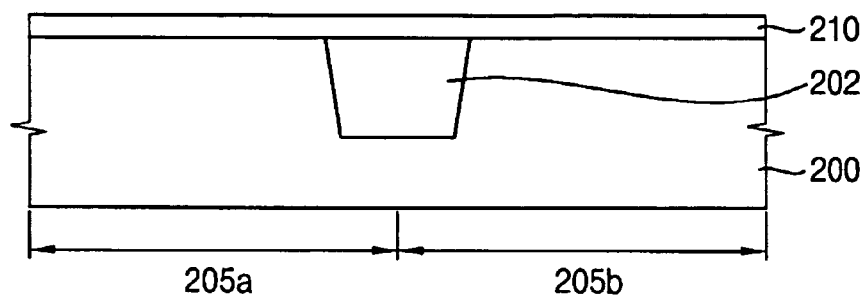

FIGS. 4 to 8 are diagrams illustrating a method of manufacturing a multiple gate oxide layer using an etching solution in accordance with example embodiments of the present invention. Referring to FIG. 4, a first oxide layer 210 may be formed on the substrate 200. The first oxide layer 210 may have a first thickness. An isolation layer 202 may be formed on a substrate 200 by an isolation process (e.g., a shallow trench isolation (STI) process) to define active regions and field regions on the substrate 200. The active regions include a first active region 205a and a second active region 205b. The first active region 205a may be a lower voltage (LV) region where a lower voltage may be applied. The second active region 205b may be a higher voltage (HV) region where a higher voltage may be applied.

The first oxide layer 210 may be formed on the substrate 200 including the active regions thereon. The first oxide layer 210 may have a first thickness. The first thickness of the first oxide layer 210 may be in a range of about 50 Å to about 80 Å. The first oxide layer 210 may be employed for forming a first gate oxide layer having the first thickness. The first oxide layer 210 may be formed by a thermal oxidation process performed under an oxidation atmosphere.

Figure 5:
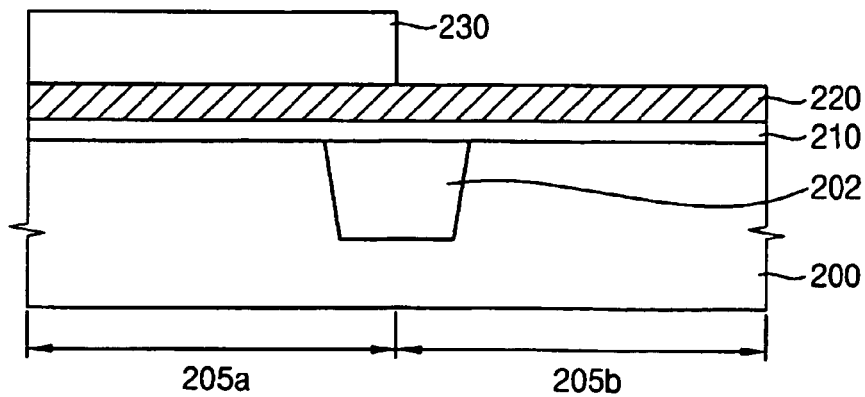

Referring to FIG. 5, a first polysilicon layer 220 may be formed on the first oxide layer 210 and then an insulation layer pattern 230 may be formed on a portion of the first polysilicon layer 220. The first polysilicon layer 220 may be formed by a chemical vapor deposition (CVD) process. In example embodiments of the present invention, the first polysilicon layer 220 may be formed by depositing polysilicon and doping impurities into deposited polysilicon. Polysilicon may be deposited by a CVD process using a source gas (e.g., a silane ($SiH_4$) gas). The source gas may further include a nitrogen ($N_2$) gas. For example, the source gas may include about 20 percent to about 30 percent by volume of the silane gas and a remainder of the nitrogen gas.

When a temperature of the deposition process is lower than about 500° C., a deposition rate of polysilicon may be slower. When the temperature of the deposition process is higher than about 650° C., the source gas may be exhausted and a deposition uniformity of polysilicon may be deteriorated. The deposition process of polysilicon may be carried out at a temperature of about 500° C. to about 650° C. Polysilicon may be deposited at a proper deposition rate when a temperature of the deposition process is in a range of about 500° C. to about 650° C. and a pressure is in a range of about 25 Pa to about 150 Pa. A doping process of impurities may include a diffusion process, an ion implantation process, an in-situ doping process and/or any other suitable process. Examples of the impurities may include phosphorus (P), arsenic (As), boron (B), indium (In) and/or any other suitable material.

The insulation layer pattern 230 may be formed on the first polysilicon layer 220 over the LV region 205a. An insulation layer may be formed on the first polysilicon layer 220. The insulation layer may be formed using an oxide (e.g., silicon oxide). A photoresist pattern may be formed on the insulation layer. The insulation layer may be patterned using the photoresist pattern as an etching mask to thereby form an insulation layer pattern 230 on the first polysilicon layer 220. The photoresist pattern may be removed from the insulation layer pattern 230 by an ashing process and/or a stripping process.

Figure 6:
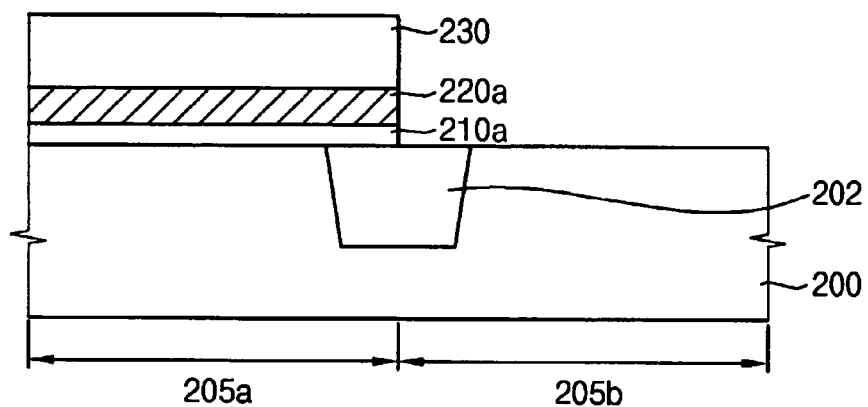

Referring to FIG. 6, the first polysilicon layer 220 and the first oxide layer 210 may be successively etched using the insulation layer pattern 230 as an etching mask. A first polysilicon layer pattern 220a and a first oxide layer pattern 210a having a first thickness may be formed on the LV region 205a of the substrate 200. The first oxide layer pattern 210a may correspond to a first gate oxide layer having the first thickness.

In example embodiments of the present invention, the first polysilicon layer 220 and the first oxide layer 210 may be etched by a wet etching process using an etching solution that may include hydrogen peroxide ($H_2O_2$) and ammonium hydroxide ($NH_4OH$) by a volume ratio of about 1:2 to about 1:10 mixed in water. The etching solution may include about 1 percent to about 6 percent by volume of hydrogen peroxide, about 3 percent to about 10 percent by volume of ammonium hydroxide and about 84 percent to about 96 percent by volume of water based on a total volume of the etching solution. An etching selectivity between the insulation layer pattern 230 and the first polysilicon layer 220 may be in a range of about 1:1.3 to about 1:3 in the etching process using the etching solution. In example embodiments of the present invention, the wet etching process may be executed at a temperature higher than about 60° C., for example, about 75° C. to about 95° C. An etching ability of the etching solution may depend on the temperature of the wet etching process.

In the wet etching process using the etching solution, the first polysilicon layer 220 may have an etching selectivity relative to the first oxide layer 220. The first oxide layer 220 may be retarded or prevented from unnecessarily etching and an etching rate of the first oxide layer 220 may be controlled. Damage to the substrate 200 may be reduced.

Figure 7:
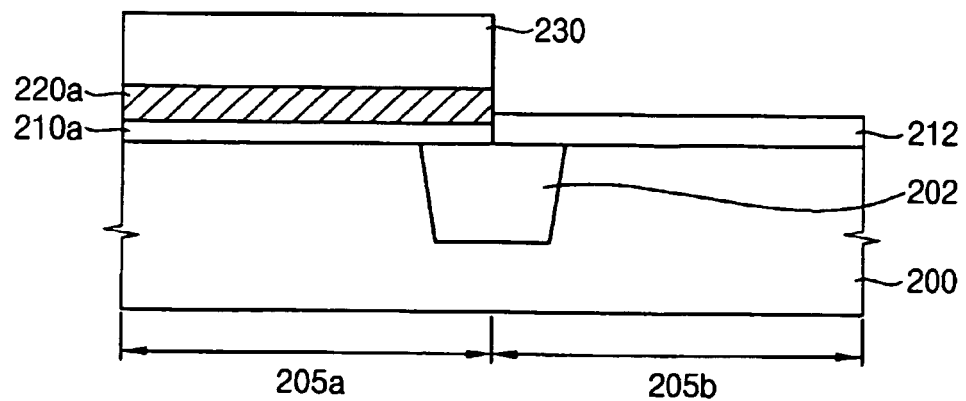

Referring to FIG. 7, a second oxide layer 212 may be formed on the substrate 200 over the HV region 205b. The second oxide layer 212 may have a second thickness. The second thickness of the second oxide layer 212 may be in a range of about 100 Å to about 150 Å. The second oxide layer 212 may be employed for forming a second gate oxide layer having the second thickness. The second oxide layer 212 may be formed by a thermal oxidation process under an oxidation atmosphere. The second oxide layer 212 may be formed on the HV region 205b of the substrate 200.

Figure 8:
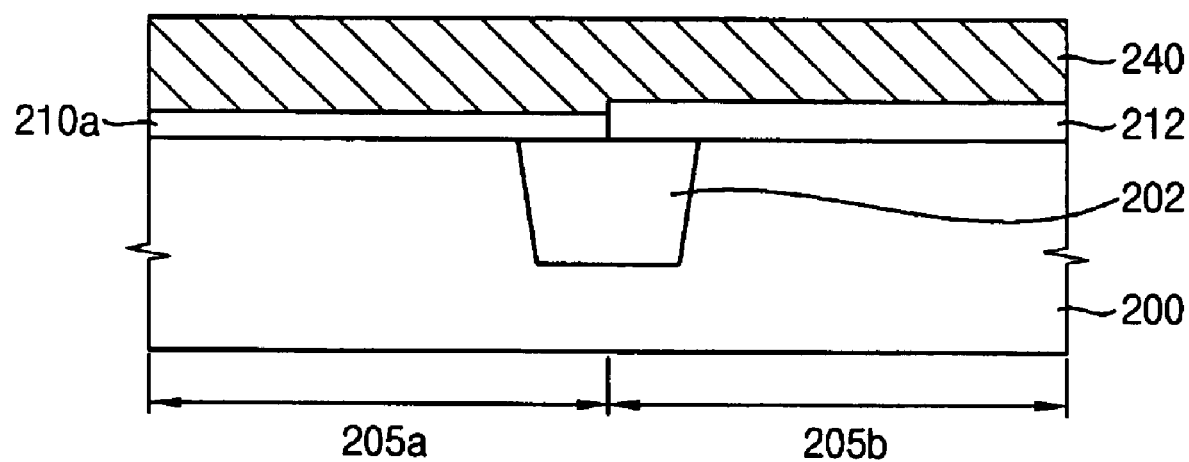

Referring to FIG. 8, the insulation layer pattern 230 on the first polysilicon layer pattern 220a may be removed. A preliminary second polysilicon layer may be formed on the first polysilicon layer pattern 220a and the second oxide layer 212. The preliminary second polysilicon layer may be planarized by a chemical mechanical polishing (CMP) process, an etch back process and/or a combination process of CMP and etch back. A second polysilicon layer 240 may be formed on the first oxide layer 210a and the second oxide layer 212. The second polysilicon layer 240 may include the first polysilicon layer pattern 210a. The second polysilicon layer 240 may be patterned to form a gate electrode. In example embodiments of the present invention, when another gate oxide layer having a third thickness is demanded, processes substantially the same as the above-described processes may be further carried out.

Method of Manufacturing a Flash Memory Device

Figure 9:
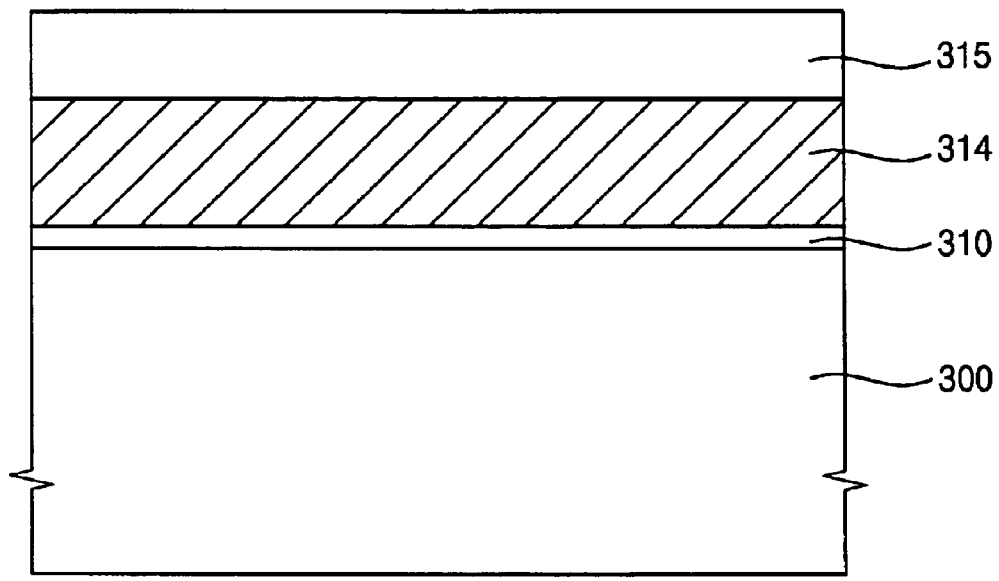

FIGS. 9 to 14 are diagrams illustrating a method of manufacturing a flash memory device using an etching solution in accordance with example embodiments of the present invention. Referring to FIG. 9, a tunnel oxide layer 310, a first conductive layer 314 and a mask layer 315 may be successively formed on a substrate 300. The substrate 300 may include a silicon wafer, a silicon-on-insulator (SOI) substrate and/or the like. The tunnel oxide layer 310 may be formed on the substrate 300. The tunnel oxide layer 310 may have a thickness of about 30 Å to about 100 Å, for example, about 60 Å. The tunnel oxide layer 310 may be formed by a thermal oxidation process and/or a CVD process. In other example embodiments of the present invention, the tunnel oxide layer 310 may be formed by a radical oxidation process. The radical oxidation process may be performed at a temperature higher than about 800° C. under a pressure lower than about 1 Torr and under an atmosphere including an oxygen ($O_2$) gas, a hydrogen ($H_2$) gas and/or a nitrogen ($N_2$) gas.

The first conductive layer 314 may be formed on the tunnel oxide layer 310. The first conductive layer 314 may be formed using polysilicon doped with impurities. The first conductive layer 314 may be formed by a low pressure CVD (LPCVD) process and/or a doping process. A polysilicon layer and/or an amorphous silicon layer may be formed by the LPCVD process. The polysilicon layer and/or the amorphous silicon layer may have a thickness of about 500 Å to about 700 Å. The doping process may include a diffusion process, an ion implantation processes, an in-situ doping process and/or any other suitable process. The mask layer 315 may be formed on the first conductive layer 314. The mask layer 315 may be formed using a material having an etching selectivity relative to the first conductive layer 314, the tunnel oxide layer 310 and the substrate 300. For example, the mask layer 315 may be formed using a nitride (e.g., silicon nitride) or an oxynitride (e.g., silicon oxynitride).

Figure 10:
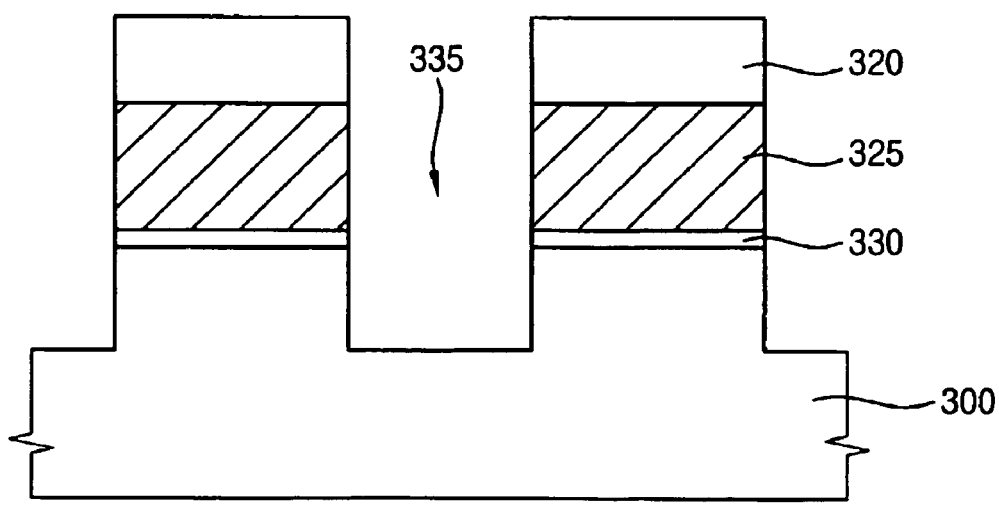

Referring to FIG. 10, a first photoresist pattern (not shown) may be formed on the mask layer 315. The mask layer 315 may be patterned using the first photoresist pattern as an etching mask to form a first mask pattern 320. The first photoresist pattern may be removed by an ashing process and/or a stripping process. The first conductive layer 314 and the tunnel oxide layer 310 may be successively etched using the first mask pattern 320 as an etching mask. A first conductive layer pattern 325 and a tunnel oxide layer pattern 330 may be formed on the substrate 300. A portion of the substrate 300 exposed by the tunnel oxide layer pattern 330 may be etched to thereby form a trench 335 at an upper portion of the substrate 300.

In example embodiments of the present invention, the first conductive layer pattern 325, the tunnel oxide layer pattern 330 and the trench 335 may be formed by a wet etching process using an etching solution. The etching solution may include hydrogen peroxide ($H_2O_2$) and ammonium hydroxide ($NH_4OH$) by a volume ratio of about 1:2 to about 1:10 mixed in water. The etching solution may include about 1 percent to about 6 percent by volume of hydrogen peroxide, about 3 percent to about 10 percent by volume of ammonium hydroxide, and about 84 percent to about 96 percent by volume of water based on a total volume of the etching solution. An etching rate ratio between the tunnel oxide layer 310 and the first conductive layer 314 may be in a range of about 1:1.3 to about 1:3 in the etching process using the etching solution.

An etching ability of the etching solution may depend on a temperature of the wet etching process. In example embodiments of the present invention, the wet etching process may be carried out at a temperature higher than about 60° C., for example, about 75° C. to about 95° C. In the wet etching process using the etching solution, the first conductive layer 314 and the substrate 300 may have an etching selectivity relative to the tunnel oxide layer 310 so that the first conductive layer 314 and the substrate 300 may be etched without etch damage to the tunnel oxide layer 310. In example embodiments of the present invention, after forming the trench 335, a liner layer may be further formed on a bottom and a sidewall of the trench 335. The liner layer may cure damage to the substrate 300 generated in an etching process of the trench 335 and may reduce generation of a leakage current.

Figure 11:
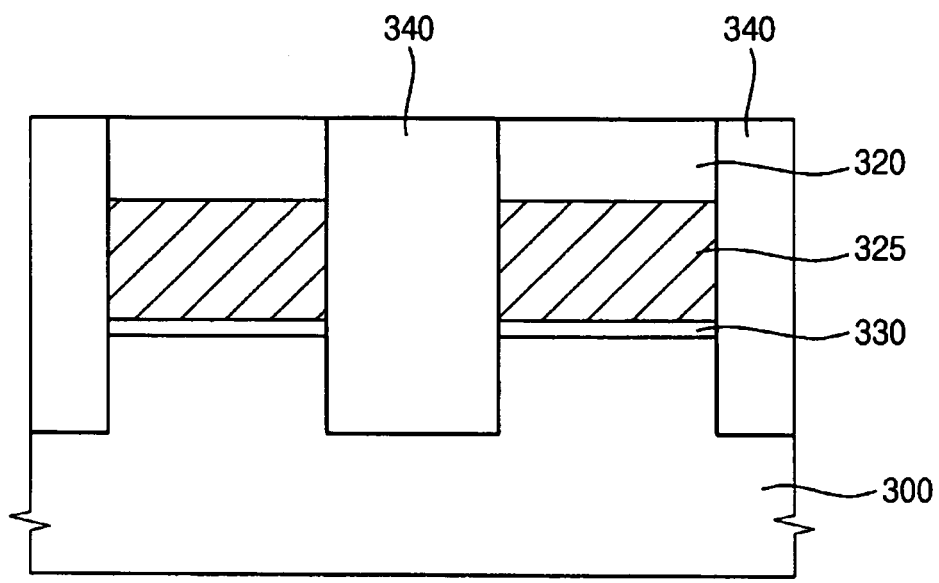

Referring to FIG. 11, an oxide layer may be formed on the substrate 300 to fill up the trench 335. The oxide layer may be partially removed by a CMP process, an etch back process and/or a combination process of CMP and etch back to form an isolation layer 340. The oxide layer may be formed by a CVD process using an oxide (e.g., HDP-CVD oxide) that may efficiently fill up the trench 335 without generation of a void or a seam. The oxide layer may be partially removed by a CMP process, an etch back process and/or a combination process of CMP and etch back until the first mask pattern 320 is exposed. The isolation layer 340 filling up the trench 335 may be formed on the substrate 300.

Figure 12:
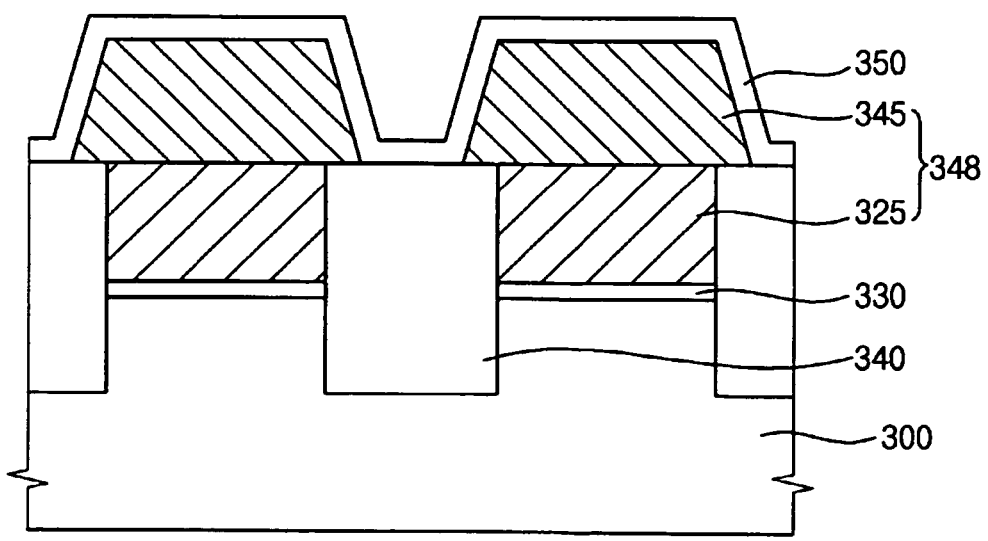

Referring to FIG. 12, the first mask pattern 320 may be removed by a wet etching process or a dry etching process. The isolation layer 340 may be partially removed until the isolation layer 340 may have a height substantially the same as that of the first conductive layer pattern 325. A second conductive layer may be formed on the first conductive layer pattern 325 and the isolation layer 340. The second conductive layer may be patterned by a photolithography process to form a second conductive layer pattern 345. The second conductive layer pattern 345 may be formed on the first conductive layer pattern 325 and a portion of the isolation layer 340 adjacent to the first conductive layer pattern 325. A preliminary floating gate 348 including the first and the second conductive layer patterns 325 and 345 may be formed. In example embodiments of the present invention, the second conductive layer may be formed by a CVD process and a doping process. A polysilicon layer or an amorphous silicon layer may be formed by the CVD process. The doping process may include a diffusion process, an ion implantation processes, an in-situ doping process and/or any other suitable process.

A second mask pattern (not shown) may be formed on the second conductive layer. The second conductive layer may be patterned using the second mask pattern as an etching mask to form the second conductive layer pattern 345 on the first conductive layer pattern 325. The second mask pattern may be removed from the second conductive layer pattern 345. The preliminary floating gate 348 including the first and the second conductive layer patterns 325 and 345 may be formed. In example embodiments of the present invention, the second conductive layer pattern 345 may not be formed.

A dielectric layer 350 may be formed on the preliminary floating gate 348. In example embodiments of the present invention, the dielectric layer 350 may be formed in a multi-layered structure including a silicon oxide layer, a silicon nitride layer and a silicon oxide layer. In other example embodiments of the present invention, the dielectric layer 350 may be formed using a high-k material. Examples of the high-k material may include hafnium oxide ($HfO_2$), zirconium oxide ($ZrO_2$), tantalum oxide ($Ta_2O_5$), yttrium oxide ($Y_2O_3$), niobium oxide ($Nb_2O_5$), aluminum oxide ($Al_2O_3$), titanium oxide ($TiO_2$), cerium oxide ($CeO_2$), indium oxide ($In_2O_3$), ruthenium oxide ($RuO_2$), magnesium oxide (MgO), strontium oxide (Sro), boron oxide ($B_2O_3$), tin oxide ($SnO_2$), lead oxide (PbO, $PbO_2$, $Pb_3O_4$), vanadium oxide ($V_2O_3$), lanthanum oxide ($La_2O_3$), praseodymium oxide ($Pr_2O_3$), antimony oxide ($Sb_2O_3$, $Sb_2O_5$), calcium oxide (CaO) and/or any other suitable material. These may be used alone or in a mixture thereof.

The dielectric layer 350 may be formed by successively depositing silicon oxide, silicon nitride and a metal oxide. In other example embodiments of the present invention, the dielectric layer 350 may be formed by successively depositing a metal oxide, silicon nitride and a metal oxide. The dielectric layer 350 may be formed by an ALD process, a CVD process and/or any other suitable process.

Figure 13:
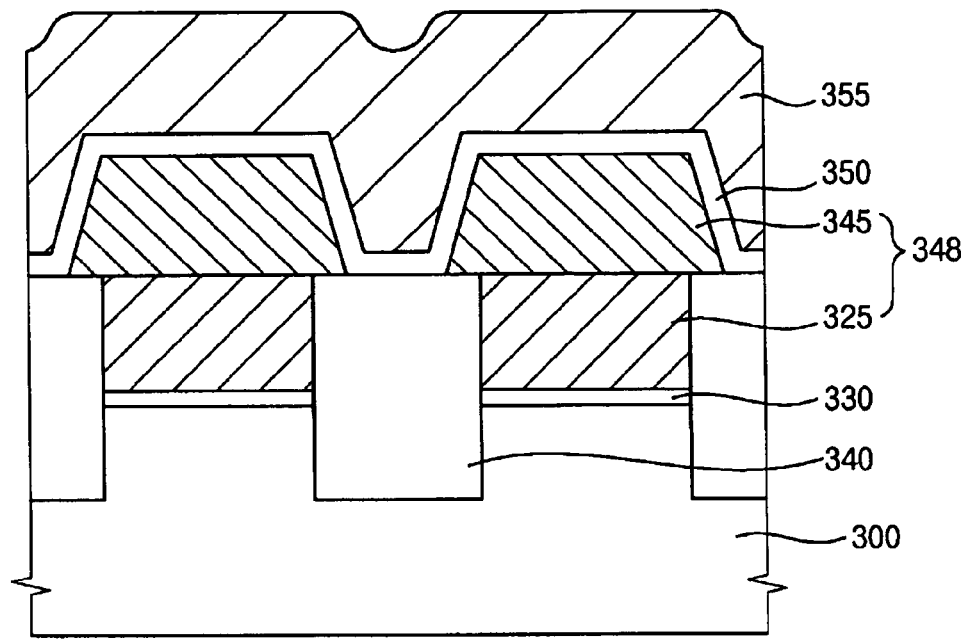

Referring to FIG. 13, a third conductive layer 355 may be formed on the dielectric layer 350. The third conductive layer 355 may be formed using polysilicon doped with N type impurities or a metal silicide. Examples of the metal silicide may include tungsten silicide, titanium silicide, cobalt silicide, tantalum silicide and/or any other suitable metal silicide.

Figure 14:
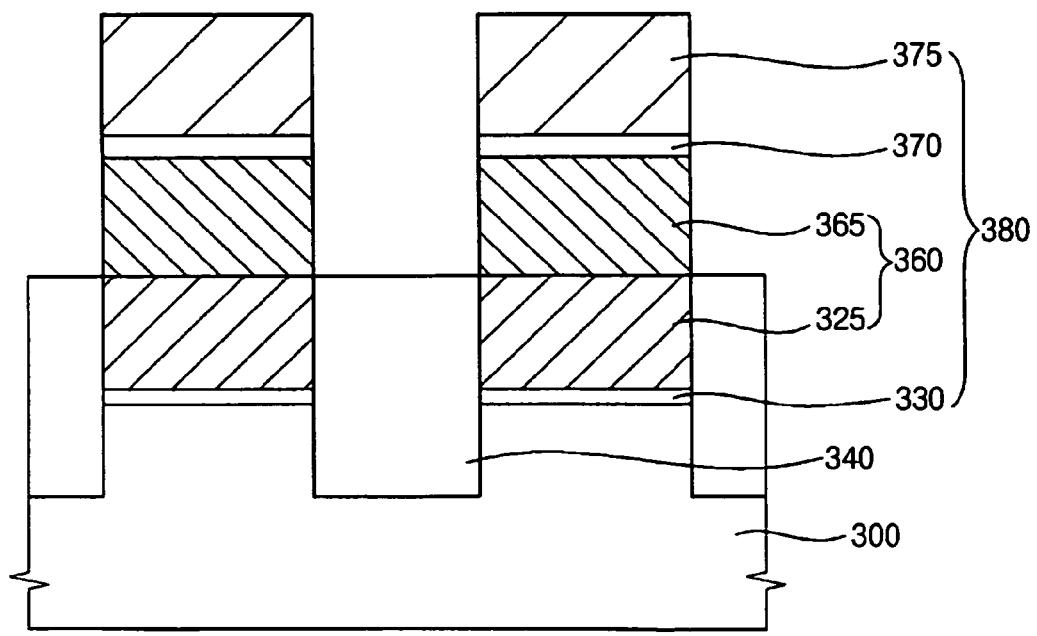

Referring to FIG. 14, a second photoresist pattern (not shown) may be formed on the third conductive layer 355. The third conductive layer 355 may be patterned using the second photoresist pattern as an etching mask. A control gate 375 may be formed on the dielectric layer 350. The dielectric layer 350 and the second conductive layer 345 may be selectively etched to form a dielectric layer pattern 370 and a second conductive layer pattern 365, respectively. The dielectric layer pattern 370 and the second conductive layer pattern 365 may be formed by a dry etching process. A floating gate 360 including the first and the second conductive layer patterns 325 and 365 may be formed. A gate structure 380 including the tunnel oxide layer pattern 330, the floating gate 360, the dielectric layer pattern 370 and the control gate 375 may be formed on the substrate 300.

Hereinafter, an etching solution according to example embodiments of the present invention will be described through various Examples and Comparative Examples.

EXAMPLE 1

An etching solution was prepared by mixing about 1 percent by volume of hydrogen peroxide, about 4 percent by volume of ammonium hydroxide and about 95 percent by volume about water based on a total volume of the etching solution.

EXAMPLE 2

An etching solution was prepared by mixing about 5 percent by volume of hydrogen peroxide, about 10 percent by volume of ammonium hydroxide and about 85 percent by volume about water based on a total volume of the etching solution.

EXAMPLE 3

An etching solution was prepared by mixing about 1 percent by volume of hydrogen peroxide, about 10 percent by volume of ammonium hydroxide and about 89 percent by volume about water based on a total volume of the etching solution.

COMPARATIVE EXAMPLE 1

An etching solution was prepared by mixing about 16 percent by volume of hydrogen peroxide, about 4 percent by volume of ammonium hydroxide and about 80 percent by volume about water based on a total volume of the etching solution.

COMPARATIVE EXAMPLE 2

An etching solution was prepared by mixing about 6 percent by volume of hydrogen peroxide, about 4 percent by volume of ammonium hydroxide and about 90 percent by volume about water based on a total volume of the etching solution.

First Evaluation of Characteristics of Etching Solutions

Etching abilities of etching solutions prepared according to Examples 1 to 3 and Comparative Examples 1 and 2 were evaluated, respectively.

In order to prepare samples for evaluating the etching abilities, a substrate was prepared. A polysilicon layer was formed on the substrate. An oxide layer pattern including openings exposing a portion of the polysilicon layer was formed on the polysilicon layer. The substrate was immersed in five beakers including etching solutions prepared according to Examples 1 to 3 and Comparative Examples 1 and 2, respectively. The substrate was immersed in the etching solutions at a temperature of about 65° C. for about 10 minutes. The substrate was immersed in deionized water for about 5 minutes to remove the etching solutions from the substrate. The substrate was dried using a nitrogen ($N_2$) gas. Etching rates of the oxide layer pattern and the polysilicon layer were measured. The etching abilities of etching solutions according to Examples 1 to 3 and Comparative Examples 1 and 2 were evaluated as the following Table 1.

TABLE 1

| | Example 1 | Example 2 | Example 3 | Comparative Example 1 | Comparative Example 2 |
|---|---|---|---|---|---|
| Etching rate of an oxide layer pattern (Å/min) | 5 | 5.3 | 5.6 | 3.5 | 4.8 |
| Etching rate of a polysilicon layer (Å/min) | 7.9 | 6.5 | 10.7 | 3.5 | 4.9 |
| A ratio of etching rate between the polysilicon layer and the oxide layer pattern | 1.6:1.0 | 1.3:1.0 | 1.9:1.0 | 1:1 | 1:1 |

As shown in Table 1, it may be noted that etching solutions according to Examples 1 to 3 have improved etching abilities for the polysilicon layer relative to those of Comparative Examples 1 and 2 at the temperature of about 65° C. An etching selectivity between the polysilicon layer and the oxide layer pattern may be improved when the etching solutions according to Examples 1 to 3 are used comparing to those of Comparative Examples 1 and 2.

Second Evaluation of Characteristics of Etching Solutions

A substrate was prepared by processes substantially the same as those of a first evaluation. The substrate was immersed in four beakers including etching solutions according to Examples 1 to 3 and Comparative Example 2, respectively. The substrate was immersed in the etching solutions at a temperature of about 80° C. for about 10 minutes. The etching solution was removed from the substrate according to processes substantially the same as those of the first evaluation. Etching rates of oxide layer pattern and polysilicon layer were measured as following Table 2.

TABLE 2

| | Example 1 | Example 2 | Example 3 | Comparative Example 2 |
|---|---|---|---|---|
| Etching rate of an oxide layer pattern (Å/min) | 10 | 12.5 | 13.1 | 11.0 |
| Etching rate of a polysilicon layer (Å/min) | 26.5 | 16.5 | 30.0 | 13.7 |
| A ratio of etching rate between the polysilicon layer and the oxide layer pattern | 2.7:1.0 | 1.3:1.0 | 2.3:1.0 | 1.2:1 |

Referring to Table 2, it may be confirmed that etching solutions according to Examples 1 to 3 have improved etching abilities for the polysilicon layer relative to that of Comparative Example 2. An etching selectivity between the polysilicon layer and the oxide layer pattern may be improved when the etching solutions according to Examples 1 to 3 are used in comparison with Comparative Example 2. Moreover, comparing the Table 2 with the Table 1, as a temperature of an etching solution increases, an etching ability for the polysilicon layer and the etching selectivity may also increase.

Third Evaluation of Characteristics of Etching Solutions

A substrate was prepared by processes substantially the same as those of a first evaluation. The substrate was immersed in four beakers including etching solutions prepared according to Examples 1 to 3 and Comparative Example 2, respectively. The substrate was immersed in the etching solutions at a temperature of about 80° C. for about 10 minutes. The etching solution was removed from the substrate according to processes substantially the same as those of the first evaluation. Etching rates of oxide layer pattern and a uniformity of the substrate were measured as following Table 3.

TABLE 3

|  | Example 1 | Example 2 | Example 3 | Comparative Example 2 |
|---|---|---|---|---|
| Etching rate of an oxide layer pattern (Å/min) | 10 | 12.5 | 13.1 | 11.0 |
| Uniformity (RMS/Rmax) of a substrate (Å) | 3.1/25 | 2.2/21 | 2.9/27 | 2.6/28 |

Referring to Table 3, it may be noted that etching solutions according to Examples 1 to 3 generate less damage to the oxide layer pattern and a surface of the substrate in comparison with that of Comparative Example 2. A deterioration of a uniformity of the substrate may be reduced.

Figure 15:
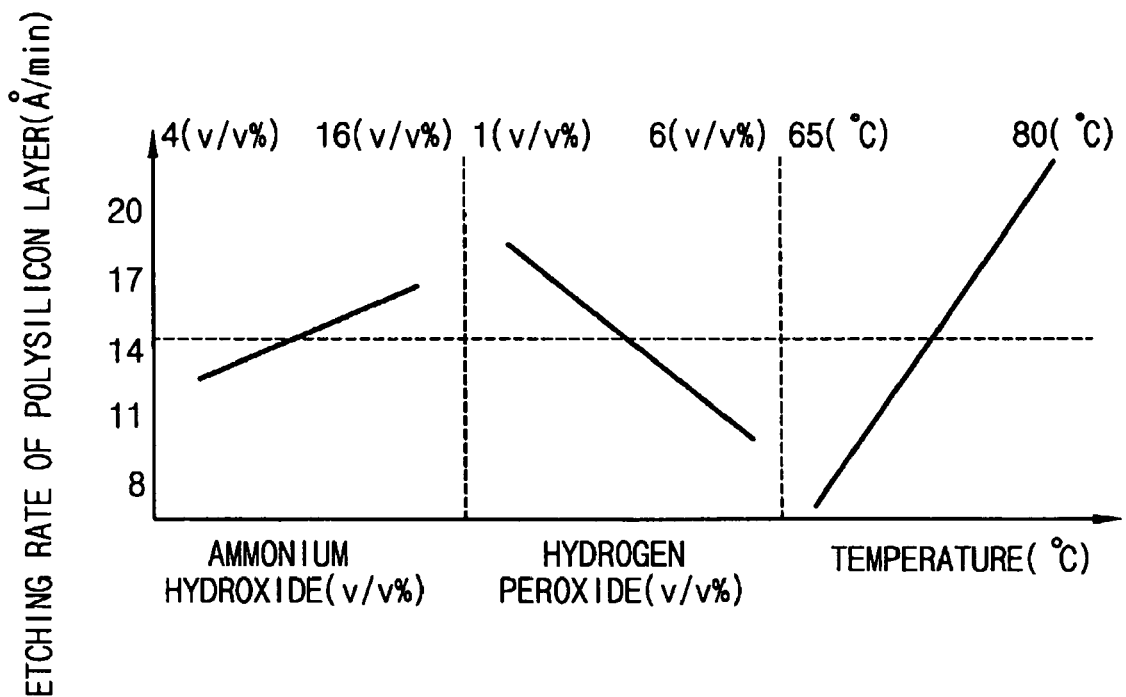

FIG. 15 is a graph illustrating an etching rate of a polysilicon layer according to a composition and a temperature of an etching solution in accordance with example embodiments of the present invention. Referring to FIG. 15, an etching rate of a polysilicon layer using an etching solution increases according to an increase of a content of ammonium hydroxide in a range of about 4 percent to about 16 percent by volume. The etching rate of the polysilicon layer increases according to an increase of the temperature of the etching solution. The etching rate of the polysilicon layer decreases according to an increase of a content of hydrogen peroxide in a range of about 1 percent to about 6 percent by volume. An etching ability for the polysilicon layer of the etching solution may be improved according to increases of the ammonium hydroxide solution and the temperature of the etching solution.

Figure 16:
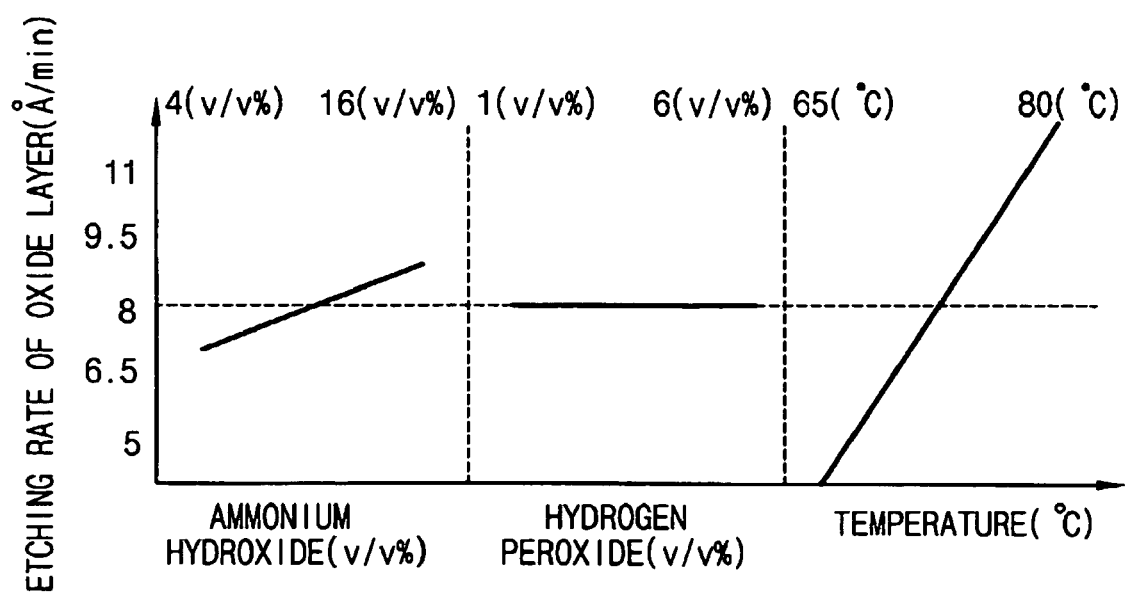

FIG. 16 is a graph illustrating an etching rate of an oxide layer according to a composition and a temperature of an etching solution in accordance with example embodiments of the present invention. Referring to FIG. 16, an etching rate of an oxide layer using an etching solution decreases according to a decrease of a content of ammonium hydroxide in a range of about 4 percent to about 16 percent by volume. The etching rate of the oxide layer decreases according to a decrease of the temperature of the etching solution. The etching rate of the polysilicon layer hardly depends on a content of hydrogen peroxide. An etching ability for the oxide layer of the etching solution may increase according to an increase of an amount of ammonium hydroxide and the temperature of the etching solution. The etching ability for the oxide layer of the etching solution may be independent of an amount of hydrogen peroxide.

Figure 17:
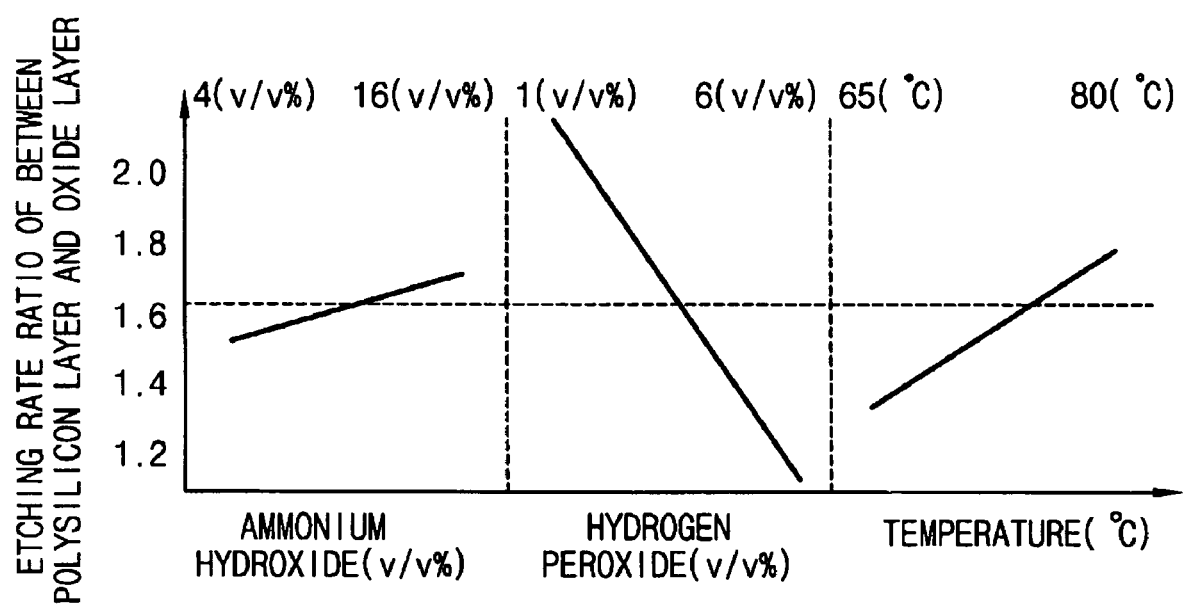

FIG. 17 is a graph illustrating an etching selectivity between a polysilicon layer and an oxide layer according to a composition and a temperature of an etching solution in accordance with example embodiments of the present invention.

Referring to FIG. 17, an etching selectivity between a polysilicon layer and an oxide layer increases according to an increase of a content of ammonium hydroxide in a range of about 4 percent to about 16 percent by volume. The etching selectivity increases according to an increase of the temperature of the etching solution. The etching selectivity decreases according to a decrease of a content of hydrogen peroxide in a range of about 1 percent to about 6 percent by volume. The etching selectivity between the polysilicon layer and the oxide layer may be improved according to the increase of the content of ammonium hydroxide and the temperature of the etching solution.

According to example embodiments of the present invention, when a polysilicon layer exposed by an oxide layer pattern is etched using an etching solution, the polysilicon layer may be etched without unnecessary etching of the oxide layer pattern. In a formation of a polysilicon layer pattern, etched damage to an oxide layer (e.g., a tunnel oxide layer) may be reduced. When a silicon substrate exposed by an oxide layer pattern including an opening is etched, an enlargement of the opening due to unnecessary etching of the oxide layer pattern may be reduced. The etching solution may be used in a wet etching process for forming the polysilicon layer pattern in a manufacturing process of a semiconductor device (e.g., a DRAM device, an SRAM device, a NOR type flash memory device, a NAND type flash memory device and/or any other suitable device). In the wet etching process using the etching solution, the polysilicon layer and the silicon substrate may be more uniformly etched without unnecessarily etching an oxide layer.

The foregoing is illustrative of example embodiments of the present invention and is not to be construed as limiting thereof. Although a few example embodiments of the present invention have been described, those skilled in the art will readily appreciate that many modifications are possible in the example embodiments without materially departing from the novel teachings and advantages of example embodiments of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of example embodiments of the present invention and is not to be construed as limited to the specific embodiments disclosed, and that modifications to the disclosed embodiments, as well as other example embodiments, are intended to be included within the scope of the appended claims. Example embodiments of the present invention are defined by the following claims, with equivalents of the claims to be included therein.

What is claimed is:

1. A method of forming a pattern comprising:
   forming a polysilicon layer on a substrate;
   forming an insulation layer pattern on the polysilicon layer, the insulation layer pattern having an opening that exposes the polysilicon layer; and
   etching the polysilicon layer exposed by the insulation layer pattern using an etching solution to form a polysilicon layer pattern, the etching solution including hydrogen peroxide ($H_2O_2$) and ammonium hydroxide ($NH_4OH$) by a volume ratio of about 1:2 to about 1:10 mixed in water.

2. The method of claim 1, wherein the etching solution includes about 1 percent to about 6 percent by volume of hydrogen peroxide, about 3 percent to about 10 percent by volume of ammonium hydroxide, and about 84 percent to about 96 percent by volume of water based on a total volume of the etching solution.

3. The method of claim 1, wherein an etching rate ratio between the insulation layer pattern and the polysilicon layer is in a range of about 1:1.3 to about 1:3.

4. The method of claim 1, wherein the insulation layer pattern includes silicon oxide.

5. The method of claim 1, wherein forming the insulation layer pattern further comprises:

forming an insulation layer on the polysilicon layer;
forming a photoresist pattern on the insulation layer;
etching the insulation layer exposed by the photoresist pattern to form the insulation layer pattern, the insulation layer pattern having the opening that exposes the polysilicon layer; and
removing the photoresist pattern.

6. The method of claim 1, further comprising:
performing a rinsing process using deionized water on the substrate to remove the etching solution and particles from the substrate; and
performing a drying process on the substrate to remove the deionized water used in the rinsing process.

7. The method of claim 1, wherein etching the polysilicon layer is performed at a temperature of about 75° C. to about 95° C.

8. The method of claim 1, wherein an etching rate of the polysilicon layer is in a range of about 17 Å/min to about 32 Å/min and an etching rate of the insulation layer pattern is in a range of about 10 Å/min to about 13 Å/min.

9. A method of manufacturing a multiple gate oxide layer comprising:
forming a first oxide layer having a first thickness on a substrate;
forming a first polysilicon layer on the first oxide layer;
forming a first insulation layer pattern on the first polysilicon layer, the first insulation layer pattern exposing a portion of the first polysilicon layer;
etching the first polysilicon layer exposed by the first insulation layer pattern and the first oxide layer using an etching solution including hydrogen peroxide ($H_2O_2$) and ammonium hydroxide ($NH_4OH$) by a volume ratio of about 1:2 to about 1:10 mixed in water until the substrate is exposed to form a first polysilicon layer pattern and a first oxide layer pattern, respectively; and
forming a second oxide layer pattern on an exposed substrate, the second oxide layer pattern having a second thickness substantially thicker than the first thickness.

10. The method of claim 9, wherein forming the second oxide layer pattern further comprises:
forming a second oxide layer having the second thickness on the exposed substrate;
removing the first insulation layer pattern;
forming a second polysilicon layer on the second oxide layer and the first polysilicon layer;
forming a second insulation layer pattern exposing a portion of the second polysilicon layer; and
etching the second polysilicon layer exposed by the second insulation layer pattern and the second oxide layer using the etching solution.

11. The method of claim 9, further comprising:
forming an isolation layer on the substrate by an isolation process to define first and second active regions and field regions on the substrate.

12. The method of claim 11, wherein the first active region is a low voltage (LV) region and the second active region is a high voltage (HV) region.

13. The method of claim 12, wherein the first insulation layer pattern is formed over the LV region and the second oxide layer is formed over the HV region.

14. A method of forming a pattern comprising:
forming a polysilicon layer on a substrate;
forming an insulation layer pattern including silicon oxide on the polysilicon layer, the insulation layer pattern having an opening that exposes the polysilicon layer; and
etching the polysilicon layer exposed by the insulation layer pattern using an etching solution to form a polysilicon layer pattern, the etching solution including hydrogen peroxide ($H_2O_2$) and ammonium hydroxide ($NH_4OH$) by a volume ratio of about 1:2 to about 1:10 mixed in water,
wherein the etching solution has a higher etching selectivity with respect to the polysilicon layer relative to the insulation layer pattern.

* * * * *